United States Patent
Varanasi et al.

(10) Patent No.: US 10,606,697 B2
(45) Date of Patent: Mar. 31, 2020

(54) METHOD AND APPARATUS FOR IMPROVED DATA RECOVERY IN DATA STORAGE SYSTEMS

(71) Applicant: Goke US Research Laboratory, Santa Clara, CA (US)

(72) Inventors: Chandra Varanasi, Santa Clara, CA (US); Engling Yeo, San Jose, CA (US)

(73) Assignee: Goke US Research Laboratory, Santa Clara, CA (US)

( * ) Notice: Subject to any disclaimer, the term of this patent is extended or adjusted under 35 U.S.C. 154(b) by 14 days.

(21) Appl. No.: 16/014,999

(22) Filed: Jun. 21, 2018

(65) Prior Publication Data

US 2019/0391870 A1    Dec. 26, 2019

(51) Int. Cl.
| | |
|---|---|
| G06F 11/10 | (2006.01) |
| H03M 13/29 | (2006.01) |
| H03M 13/00 | (2006.01) |
| G11C 29/52 | (2006.01) |

(52) U.S. Cl.
CPC .......... G06F 11/1068 (2013.01); G11C 29/52 (2013.01); H03M 13/2906 (2013.01); H03M 13/616 (2013.01)

(58) Field of Classification Search
CPC .............. G06F 11/1068; G11C 29/52; H03M 13/2906; H03M 13/616
USPC ....... 714/755, 752, 763, 766, 768, 769, 770, 714/773, 799
See application file for complete search history.

(56) References Cited

U.S. PATENT DOCUMENTS

| | | | |
|---|---|---|---|
| 6,229,458 B1 | 5/2001 | Altekar et al. | |
| 8,020,063 B2* | 9/2011 | Olaker | H03M 13/11 714/755 |
| 8,261,167 B1* | 9/2012 | Northcott | H03M 13/152 714/758 |
| 9,184,832 B2* | 11/2015 | Kilian | H03M 13/6306 |
| 9,537,508 B1* | 1/2017 | Nguyen | H03M 13/1105 |
| 2002/0007438 A1 | 1/2002 | Lee | |
| 2004/0225944 A1 | 11/2004 | Brueggen | |
| 2005/0193312 A1 | 9/2005 | Smith et al. | |
| 2007/0124652 A1* | 5/2007 | Litsyn | G06F 11/1068 714/776 |
| 2008/0140686 A1 | 6/2008 | Hong et al. | |
| 2009/0217124 A1* | 8/2009 | Litsyn | G06F 11/1068 714/752 |
| 2009/0241008 A1* | 9/2009 | Kim | G06F 11/1072 714/755 |
| 2010/0138720 A1* | 6/2010 | Myung | H03M 13/1165 714/752 |

(Continued)

OTHER PUBLICATIONS

Ferreira et al., Error and Erasure Control (d, k) Block Codes, Sep. 1991, IEEE, vol. 37, No. 5, pp. 1399-1408. (Year: 1991).*

(Continued)

*Primary Examiner* — John J Tabone, Jr.
(74) *Attorney, Agent, or Firm* — Intellectual Property Law Group LLP

(57) ABSTRACT

A method and apparatus for improved data recovery in data storage systems is described. When errors occur while retrieving a plurality of codewords from a plurality of storage devices, a long vector may be formed from the plurality of codewords and decoded by a special, long parity check matrix to re-create data stored on the plurality of storage devices when normal decoding efforts fail.

17 Claims, 5 Drawing Sheets

(56) References Cited

U.S. PATENT DOCUMENTS

| | | | | |
|---|---|---|---|---|
| 2011/0004812 A1* | 1/2011 | Yang | ............... | G06F 11/1048 |
| | | | | 714/782 |
| 2011/0276855 A1* | 11/2011 | Jeong | ............. | H03M 13/033 |
| | | | | 714/752 |
| 2016/0329913 A1* | 11/2016 | Cideciyan | ......... | G06F 11/1076 |
| 2019/0028117 A1* | 1/2019 | Xiong | ............ | H03M 13/1162 |
| 2019/0165809 A1* | 5/2019 | Tseng | ............. | H03M 13/616 |

OTHER PUBLICATIONS

Gregori et al., On-Chip Error Correcting Techniques for New-Generation Flash Memories, Apr. 2003, IEEE, vol. 91, No. 4, pp. 602-616. (Year: 2003).*

Shin et al., New Decoding Scheme for LDPC Codes Based on Simple Product Code Structure, Aug. 2015, IEEE, vol. 17, No. 4, pp. 351-361. (Year: 2015).*

Authors et. al.: Disclosed Anonymously, Method and Device for Multi Phase Error-Correction, Oct. 18, 2006, IP.com Prior Art Database Technical Disclosure, pp. 1-65. (Year: 2006).*

International Search Report, dated Sep. 17, 2019, for corresponding International Application No. PCT/US2019/038479.

Written Opinion of the International Searching Authority, dated Sep. 17, 2019, for corresponding International Application No. PCT/US2019/038479.

Yuan et al., "A Randomly Expandable Method for Data Layout of RAID Storage System." In: arXiv preprint. Aug. 22, 2017 (Aug. 22, 2017) from <https://arxiv.org/ftp/arxiv/papers/1709/1709.04708.pdf> entire document.

* cited by examiner

METHOD AND APPARATUS FOR IMPROVED DATA RECOVERY IN DATA STORAGE SYSTEMS

BACKGROUND

I. Field of Use

The present invention relates to the field of digital storage systems and more specifically to improving the error correction capabilities of data storage systems.

II. Description of the Related Art

RAID storage systems have been used for years to redundantly store large amounts of data, used in applications such as online storage. Error Correcting Codes have been developed that recover erasures of stored data (as opposed to errors). Some codes, such as the well-known Reed-Solomon code, are forward error correction (FEC) codes that transform messages of k bits into longer codewords of n symbols such that the original message can be recovered from a subset of the n symbols. The fraction r=k/n is called the code rate, where k and n are the information packet length and codeword length, respectively. Codewords are stored on a number of independent storage media, such as pages in a flash memory, blocks, LUNs, Planes or Medium, any of which can be considered to have independent error statistics.

More recently, other coding techniques have been used, including low-density parity check (LDPC) codes In a storage system having m independent storage media, an $i^{th}$ media may store an $i^{th}$ codeword $v_i$ encoded using a generator matrix Gi and decoded using a corresponding parity check matrix $H_i$, where $1 \leq i \leq m$. In standard RAID systems, each codeword is XORed with each other prior to storage, forming a parity codeword $v_{m+1}$.

If any single codeword $v_i$ fails, $1 \leq i \leq m+1$, it is recovered by performing an XOR function of all the remaining m successfully-decoded codewords $\{v_{i1}, v_{i2}, \ldots, v_{im}\}$. Such a scheme cannot recover more than one failed medium.

SUMMARY

The embodiments herein describe methods and apparatus for retrieving data by a data storage and retrieval system. In one embodiment, a method is described, comprising generating a plurality of data blocks from a quantity of unencoded data, receiving, by a plurality of encoders, a respective one of the plurality of data blocks, encoding the plurality of data blocks by the plurality of encoders, respectively, to generate a plurality of codewords, logically combining the plurality of codewords to generate an encoded parity block, storing the plurality of codewords and the encoded parity block in a plurality of data storage media, respectively, retrieving the plurality of codewords and the encoded parity block from the data storage media, and decoding each of the plurality of codewords. When at least two of the codewords cannot be decoded correctly, generating a long vector from the plurality of codewords and the encoded parity block, and decoding the long vector using a long parity check matrix to re-create the data blocks.

In another embodiment, a data retrieval system is described, comprising plurality of decoders, a memory for storing processor-executable instructions and a long parity check matrix, and a processor coupled to the plurality of decoders and the memory for executing the processor-executable instructions that causes the data retrieval system to retrieve, by the plurality of decoders, a plurality of codewords from a plurality of data storage media, respectively, and decode each of the plurality of codewords by the plurality of decoders. When at least two of the codewords cannot be decoded correctly, retrieve an encoded parity block from a first data storage media, generate, by the processor, a long vector from the plurality of codewords and the encoded parity block, and decode the long vector using the long parity check matrix to re-create a plurality of data blocks that were stored by the data retrieval system.

BRIEF DESCRIPTION OF THE DRAWINGS

The features, advantages, and objects of the present invention will become more apparent from the detailed description as set forth below, when taken in conjunction with the drawings in which like referenced characters identify correspondingly throughout, and wherein.

DETAILED DESCRIPTION

Figure 1:
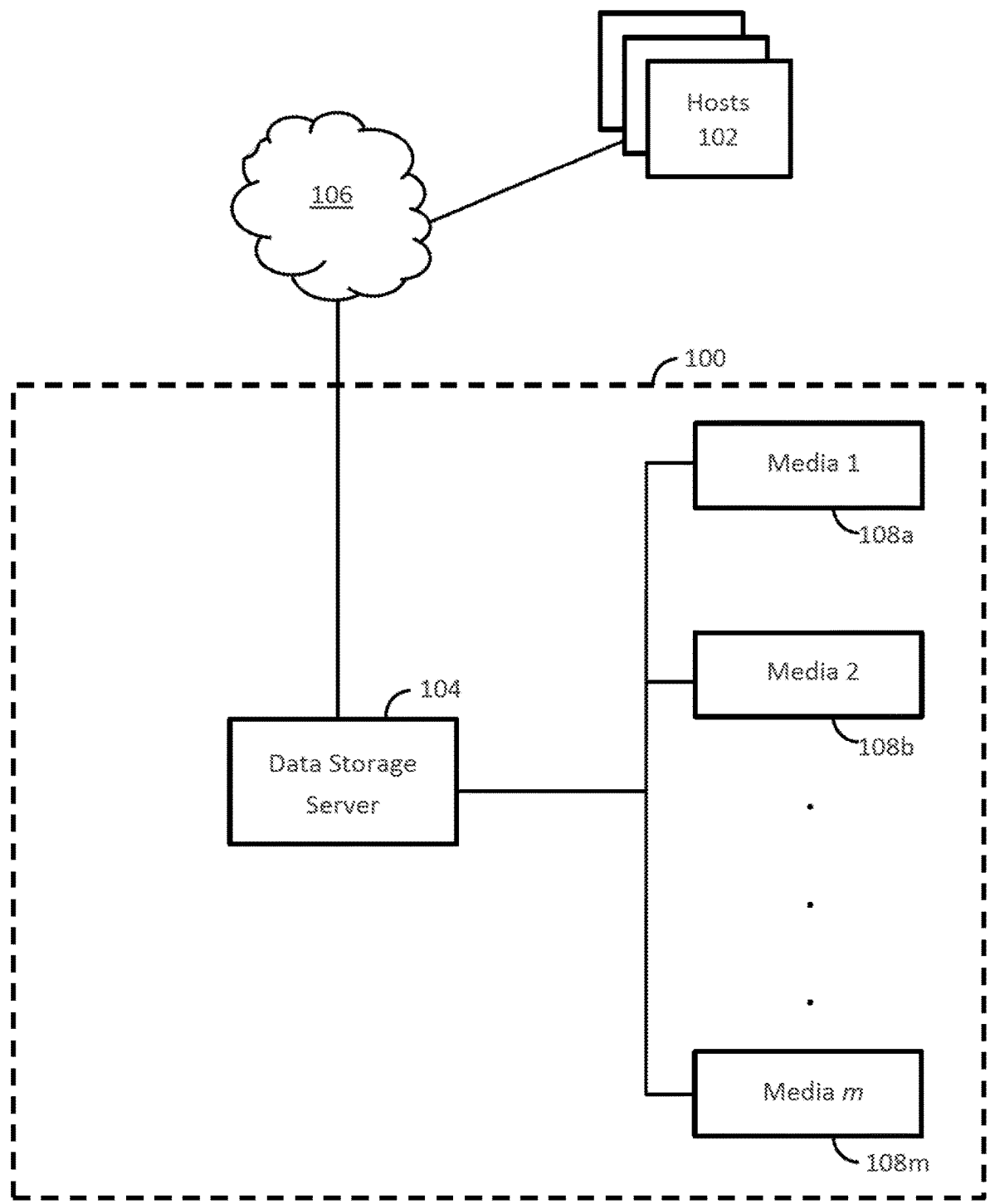
FIG. 1 is a block diagram of one embodiment of a data storage and retrieval system for storing and retrieving data with increased data recovery characteristics.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments of the invention. However, it will be apparent that various embodiments may be practiced without these specific details. The figures and description are not intended to be restrictive.

The ensuing description provides exemplary embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, RAM, ROM, etc. A computer-readable tedium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

The embodiments described herein provide specific improvements to a data storage system. For example, the embodiments allow the storage system to recover more data in the event of erasures or errors due to, for example, media failures or noise.

FIG. 1 is a simplified block diagram of one embodiment of a data storage and retrieval system 100 used for storing large amounts of data in accordance with the teachings herein. In the embodiment shown in FIG. 1, numerous hosts 102 provide unencoded data to data storage server 104 via wide-area network 106, such as the Internet, and data storage server 104 processes the data for storage in a plurality of data storage media 108a-108m. Such data storage systems are used in cloud storage models, in which digital data may be stored in logical pools, physical storage may span multiple servers (and often locations), and the physical environment is typically owned and managed by a hosting company. These cloud storage providers are responsible for keeping the data available and accessible, and the physical environment protected and running. People and organizations buy or lease storage capacity from the providers to store user, organization, or application data. Example of such cloud storage include Amazon's S3, Google's Cloud Storage and Microsoft's Azure storage platforms.

The data received from hosts 102 is stored in data storage media 108 using forward error correcting codes to mathematically calculate extra redundant data. In some embodiments, data storage and retrieval system 100 may, in addition, replicate data for redundant storage. Erasure encoding and replication are well-known methods for protecting data from loss, due to noisy transmission channels or failure of one or more storage media.

Figure 2:
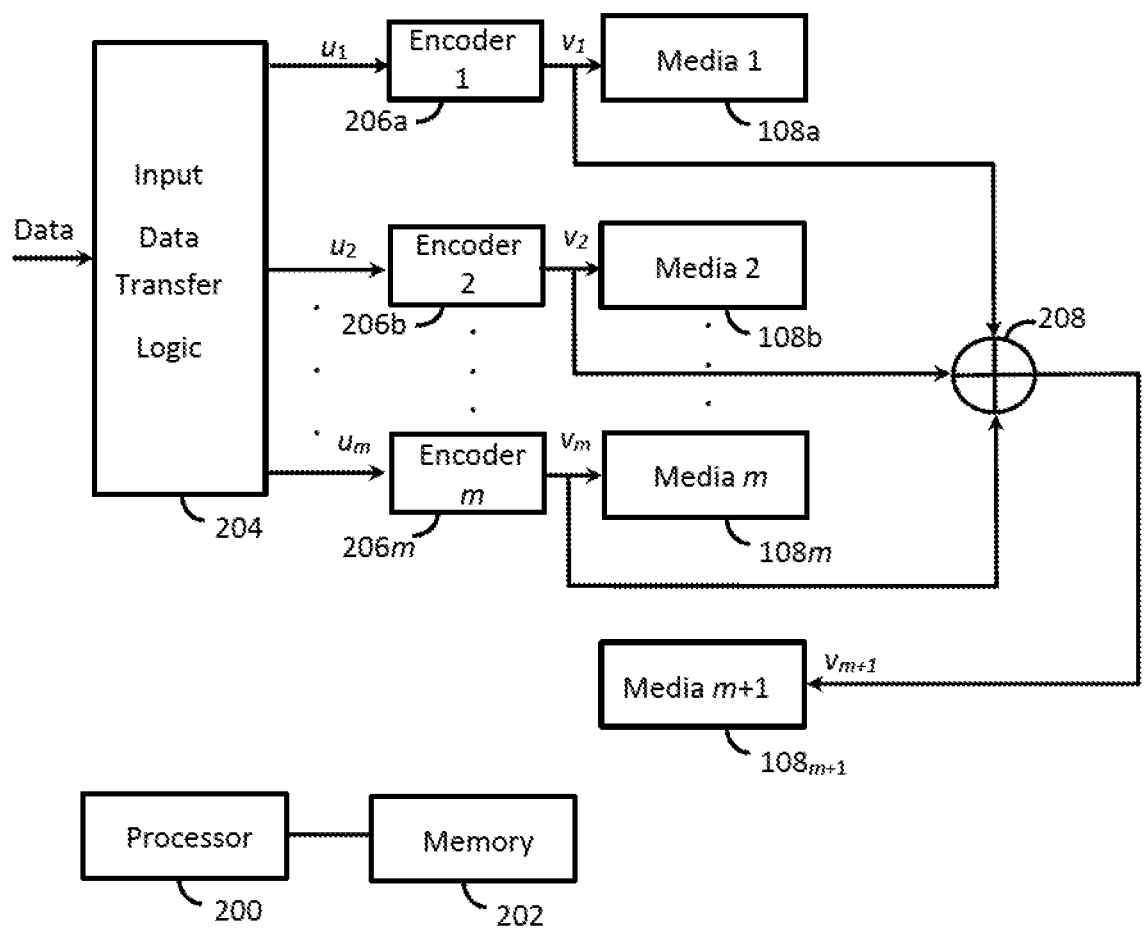
FIG. 2 is a block diagram of one embodiment of an encoder portion of the data storage and retrieval system as shown in FIG. 1.

FIG. 2 is a block diagram of one embodiment of an encoder portion of data storage and retrieval system 100. Processor 200 executes processor-executable instructions stored in memory 202 to store data in accordance with the teachings herein. Some of the functionality to store and retrieve data may be performed by processor 200, while others may be performed by the various functional blocks shown in FIG. 2. Each of the functional components shown in FIG. 2 may be integrated into a custom integrated circuit, such as an Application Specific Integrated Circuit (ASIC) or a custom System on a Chip (SoC). In other embodiments, one or more of the components shown in FIG. 2 may be integrated into one or more custom integrated circuits, while other functional components may comprise integrated circuits, discreet components, or a combination thereof. Each of the functional blocks shown in FIG. 2 may utilize either separate or shared processing and memory resources. Processor 200 comprises one or more microprocessors, microcontrollers and/or custom or custom integrated circuits, and/or discrete components able to carry out the functionality required for operation of data storage and retrieval system 100. Processor 400 may be selected based on processing capabilities, power-consumption properties, and/or cost and size considerations. Memory 202 comprises one or more information storage devices, such RAM, ROM, Flash, and/or virtually any other type of electronic memory device. Typically, memory 202 comprises more than one type of memory. For example, a ROM may be used to store static processor-executable instructions, while a RAM memory or flash memory may be used to store variable data. Memory 202 may be used to store a variety of matrices used to encode and decode data.

Data from hosts 102 is provided to input data transfer logic 200, typically via wide-area network 104, where input data transfer logic 200 may apportion a predetermined number of bits, bytes or symbols of the data (i.e., "segments") into a plurality of m unencoded data blocks, each data block comprising a predetermined number of bits, bytes or symbols and, in general, k bits. Input data transfer logic 200 comprises circuitry for receiving data from a large number of hosts 102, such as cellular telephones, personal computers, cloud-based servers, etc. The unencoded data blocks $u_i$ are typically generated in parallel as data is received by input data transfer logic 200. In the example shown in FIG. 2, a predetermined number of bits, bytes or symbols of the data is apportioned into in data blocks (where m>2), and the data blocks are provided to encoders 202a-202m, respectively. It should be understood that in other embodiments, fewer encoders may be used to encode the data blocks. For example, if four parallel data blocks are generated by input data transfer logic 200, two encoders could be used to encode the data blocks, each encoder responsible for encoding two of the four data blocks.

Encoders 202a-202m each comprise a forward error correction encoder, such as a low-density parity check (LDPC) encoder that encodes the data blocks using a low-density generator matrix G. In one embodiment, each of the encoders uses the same G matrix to encode respective data blocks, while in another embodiment, two or more of the encoders use different G matrices.

Encoders $202a$-$202m$ generate encoded data blocks, or codewords, respectively, where $2 \leq i \leq m$, and the codewords $v_i$ from each encoder is stored in a respective independent data storage media $108a$-$108m$, respectively. Data storage media $108a$-$108m$ comprises two or more independent hard drives, solid state drives, pages in a memory device, logical unit numbers (LUNs), or any other electronic, optical or mechanical information storage device or portion thereof. Each data storage media 108 typically comprises different error statistics, i.e., the likelihood of a failure due to factors such as technology, age, temperature, or humidity. In one embodiment, data storage media 108 are part of data storage and retrieval system 100 and co-located therewith, for example, as part of a rack-mounted data storage system located in a physical data center. In other embodiments, one or more of the data storage media 108 are remotely located from data storage server 104, for example, located in a different physical location than data storage server 104 and accessed via the Internet.

The codewords $v_i$ are additionally used to create a parity codeword $v_{m+1}$ by logically combining the codewords from each of the encoders by logic circuitry 208. Logic circuitry 208 typically comprises hardware and/or firmware to combine the codewords using an exclusive OR, or XOR, function on a bit-wise basis. The parity codeword can be used to recover from erasures when retrieving the codewords from the data storage units 108 by XORing the parity codeword with each of the available codewords from data storage units 108, as will be explained in greater detail later herein.

Each encoders $202a$-$202m$ generates codewords, each comprising information bits and parity bits, and each having a length greater than the data block. In coding terminology, R=k/n, where, where R is the encoding rate, n is the length of each codeword and k is the length of the original, unencoded data block. The codewords are generated as a result of applying a generator matrix G to each of the data blocks, in an embodiment where encoders comprise LDPC encoders.

Figure 3:
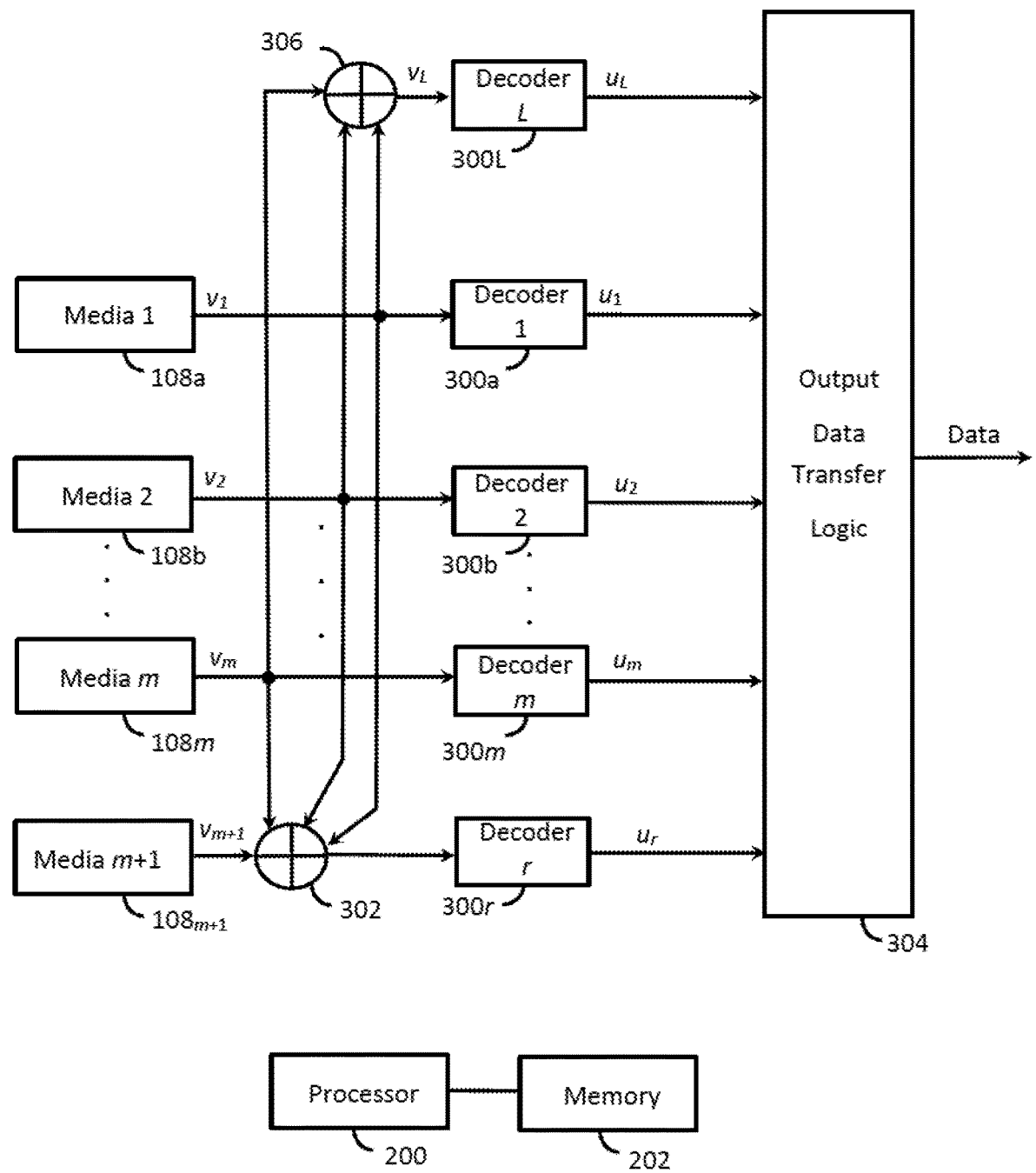
FIG. 3 is a block diagram of one embodiment of a decoder portion of the data storage and retrieval system as shown in FIG. 1.

FIG. 3 is a block diagram of one embodiment of a decoder portion of data storage and retrieval system 100. As before, processor 200 executes processor-executable instructions stored in memory 202, in this case to retrieve data from data storage media 108 in accordance with the teachings herein. Some of the functionality to retrieve data may be performed by processor 200, while others may be performed by the various functional blocks shown in FIG. 3.

M codewords are retrieved, generally in parallel, from data storage media $108a$-$108m$. In the embodiment shown in FIG. 3, the codewords are each decoded using an independent decoder $300a$-$300m$, respectively. In other embodiments, a fewer number of decoders may be used to decode the m codewords. An $i^{th}$ decoder 300 applies an H parity check matrix to the codewords, respectively, to re-create data blocks $u_i$. The H parity check matrix used by the decoders may all be the same, or two or more may be different from one another, depending on whether different generator matrices G were used to encode the data. Each of the decoders uses an iterative decoding technique, such as a message passing algorithm, that is then used by each decoder to try and re-create the data words $u_i$, respectively.

The decoder shown in FIG. 3 can detect and correct errors caused by failed storage media and/or noise in the channel between the storage media and the decoders $300a$-$300m$ in three ways.

First, errors from each data storage media may be corrected by decoders $300a$-$300m$, respectively. That is, decoder $300a$ may be able to correct errors due to noise in the transmission medium between data storage media $108a$ and decoder $300a$ using well-known error correction decoding techniques, such as the use of LDPC decoding techniques. As previously mentioned, each of decoders $300a$-$300m$ utilizes an iterative decoding technique, such as a message passing algorithm, to provide hard or soft decoding of a respective codeword.

Second, erasures may be detected and corrected using logic circuitry 302, when one of the data storage media fail. Logic circuitry 302 comprises hardware and/or firmware to combine the codewords from all of the other data storage media plus parity media $108_{m+1}$ using an exclusive OR, or XOR, function on a bit-wise basis. The decoded codeword, data block $u_r$ is provided to output data transfer logic 304, where it is combined with the other successfully decoded data blocks to form the original data provided by one of the host(s) 102.

Third, errors from any of the data storage media may be detected and corrected by constructing a "long vector" $v_L$ as a way to utilize information in all of the received codewords to aid in the error detection and correction process.

In one embodiment, the long vector $v_L$ is formed as a concatenation of the m individual codewords and $v_{m+1}$ as they are generated by encoders $206a$-$206m$ and logic circuitry 208 during the encoding process. In matrix notation, $v_L$ may be expressed as:

$$v_L = [u_1 \ u_2 \ \ldots \ u_m] \begin{bmatrix} G_1 & 0 & \ldots & G_1 \\ 0 & G_2 & \ldots & G_2 \\ & & \ddots & \\ 0 & \ldots & G_m & G_m \end{bmatrix}$$

where $G_1, G_2 \ldots G_m$ are each a different generator matrix used by respective ones of the encoders $206a$-$206m$ to encode data blocks $u_1$-$u_m$, respectively.

$G_L$ may be defined as:

$$G_L = \begin{bmatrix} G_1 & 0 & \ldots & G_1 \\ 0 & G_2 & \ldots & G_2 \\ & & \ddots & \\ 0 & \ldots & G_m & G_m \end{bmatrix}$$

The matrix $G_L$ comprises ink rows by n(m+1) columns, and it can be alternatively used to generate the n(m+1)-long vector $v_L$, as $v_L = [u_1 \ u_2 \ \ldots \ u_m] G_L$. In one embodiment, where the same generator matrix is used by each of the encoders $206a$-$206m$ to encode the data blocks, i.e., $G_i$=G, $1 \leq i \leq m$, $G_L$ can be more succinctly expressed as a tensor product as follows:

$$G_L = [I_m | 1_m] \otimes G$$

where $I_m$ is an m×m identity matrix, $1_m$ is an (m×1)-long column vector of all 1s, G is the generator matrix common to all the encoders, the vertical bar | denotes a partition of the matrix, and $\otimes$ represents a tensor product function. Since the vector $v_{m+1}$ is simply a linear combination of codewords $v_1$, $v_2, \ldots, v_m$, each generated from the same generator matrix G, $v_{m+1}$ itself is a codeword in the space of codewords generated by G, and, as such, could be decoded using the decoding algorithm used to decode $v_i$, where $1 \leq i \leq m$.

Regarding a tensor product of two matrices A and B of size (m×n) and (p×q) respectively, the tensor product between them, denoted by A⊗B, is defined as follows: every element of A individually multiplies the whole matrix B and, therefore, the size of the resulting matrix is (mp×nq). Note that A and B need not be matrix-multiplication-compatible in the conventional sense to compute their tensor product. For example, if:

$$A = \begin{bmatrix} 1 & 0 & 1 \\ 0 & 1 & 1 \end{bmatrix}; B = \begin{bmatrix} 1 & 1 & 1 \\ 0 & 1 & 1 \\ 0 & 0 & 1 \end{bmatrix}$$

Then, $$A \otimes B = \begin{bmatrix} 1 \cdot B & 0 \cdot B & 1 \cdot B \\ 0 \cdot B & 1 \cdot B & 1 \cdot B \end{bmatrix}$$

which results in $$A \otimes B = \begin{bmatrix} 1 & 1 & 1 & 0 & 0 & 0 & 1 & 1 & 1 \\ 0 & 1 & 1 & 0 & 0 & 0 & 0 & 1 & 1 \\ 0 & 0 & 1 & 0 & 0 & 0 & 0 & 0 & 1 \\ 0 & 0 & 0 & 1 & 1 & 1 & 1 & 1 & 1 \\ 0 & 0 & 0 & 0 & 1 & 1 & 0 & 1 & 1 \\ 0 & 0 & 0 & 0 & 0 & 1 & 0 & 0 & 1 \end{bmatrix}$$

Clearly, A⊗B≠B⊗A.

A long parity check matrix $H_L$ may be formed to decode data blocks encoded using the long $G_L$ matrix. Such a $H_L$ matrix is formed such that $G_L * H'_L$ is an all-zero matrix of size mk×n(m+1)−mk, which ensures that $v_L$ is a codeword generated from $G_L$, allowing decoding of $v_L$ using the $H_L$ matrix.

Since the vector $v_{m+1}$ is an XOR-combination of individual codewords generated by encoders 206a-206m using the same generator matrix G, it does not contain any independent bits, and as such, could potentially constitute some of the parity bits of $v_L$. Since the only independent bits in constructing $v_L$ using $G_L$ are $\{u_1, u_2, \ldots u_m\}$, where each $u_i$ is k-bits long, $1 \leq i \leq m$, assuming that an $H_L$ exists for $G_L$, the code rate $R_L$ of the long codeword $v_L$ is given by $$R_L = \frac{mk}{n(m+1)} = \left(\frac{m}{m+1}\right)R < R.$$

The higher the value of m, the closer $R_L$ is to R. The lower the value of m, the better its performance will be.

As an example, a data storage and retrieval system may be defined that uses three codewords for each segment of unencoded data from host 102, i.e., m=3. A generator matrix G may be defined and stored in memory 202 as a 2×4 matrix as shown below, to encode data blocks of 2 bits into codewords 4 bits long (i.e., k=2, n=4).

$$G = \begin{bmatrix} 1 & 1 & 1 & 0 \\ 0 & 1 & 0 & 1 \end{bmatrix}$$

Since G is in systematic form G=[P|I₂] where I₂ denotes a 2×2 identity matrix, and P denotes a k×(n−k) matrix, the corresponding H matrix is given by H=[I₂|P'] (where ' represents "the transpose of"):

$$H = \begin{bmatrix} 1 & 0 & 1 & 0 \\ 0 & 1 & 1 & 1 \end{bmatrix}$$

The product G*H' yields a 2×2 all-zero matrix, as expected. $G_L$ may now be formed as a matrix having 6 rows and 16 columns:

$$G_L = \begin{bmatrix} 1 & 1 & 1 & 0 & 0 & 0 & 0 & 0 & 0 & 0 & 0 & 0 & 1 & 1 & 1 & 0 \\ 0 & 1 & 0 & 1 & 0 & 0 & 0 & 0 & 0 & 0 & 0 & 0 & 0 & 1 & 0 & 1 \\ 0 & 0 & 0 & 0 & 1 & 1 & 1 & 0 & 0 & 0 & 0 & 0 & 1 & 1 & 1 & 0 \\ 0 & 0 & 0 & 0 & 0 & 1 & 0 & 1 & 0 & 0 & 0 & 0 & 0 & 1 & 0 & 1 \\ 0 & 0 & 0 & 0 & 0 & 0 & 0 & 0 & 1 & 1 & 1 & 0 & 1 & 1 & 1 & 0 \\ 0 & 0 & 0 & 0 & 0 & 0 & 0 & 0 & 0 & 1 & 0 & 1 & 0 & 1 & 0 & 1 \end{bmatrix}$$

$V_L$ may now be determined using one of two methods, as shown in the following example. Given three data blocks $u_1=[1\ 1]$; $u_2=[1\ 0]$; $u_3=[0\ 1]$, and the G matrix shown above, the codeword for each data block is shown below:

$v_1=[\mathbf{1\ 1}]*G=\mathbf{1}\ 0\ \mathbf{1}\ 1$;

$v_2=[\mathbf{1\ 0}]*G=\mathbf{1}\ 1\ 1\ 0$;

$v_3=[\mathbf{0\ 1}]*G=\mathbf{0}\ 1\ 0\ 1$;

In the codewords above, and hereafter, the information bits are shown in boldface. $V_L$ may now be determined by multiplying $u*G_L$ where u is a concatenation of the information bits of the codewords, or a concatenation of simply the data blocks, i.e., $[u_1\ u_2\ u_3]$ which yields:

$v_L=[\mathbf{1\ 1\ 1\ 0\ 0\ 1}]*G_L=[1\ 0\ 1\ 1\ 1\ 1\ 1\ 0\ 0\ 1\ 0\ 1\ 0\ 0\ 0\ 0]$ In a second method, $v_L$ can be determined simply by concatenating each of the codewords $v_1$, $v_2$, and $v_3$, with $v_4$, where $v_4$ is equal to $v_1 \oplus v_2 \oplus v_3$. The term "concatenating" as used herein, is to form a row vector comprising codewords arranged ins successive alignment.

Referring back to FIG. 3, decoder 300L uses a long parity check matrix $H_L$ to decode the long vector $v_L$. In one embodiment, $H_L$ comprises a tensor product matrix. As there are only mk independent bits in $v_L$, $H_L$ should comprise (m+1)n−mk independent rows. Since each bit $v_{ij}$ in $v_L=\{v_{ij}\}$, $1 \leq i \leq n$, $1 \leq j \leq m$ is already checked by (n-k) parity bits in the H matrix, and since each $v_{ij}$ participates in generating a bit $b_i$, $1 \leq i \leq n$ in $v_{m+1}$, a candidate $H_L$ matrix can be constructed as follows:

$$H_L = \begin{bmatrix} H & 0 & \ldots & 0 & 0 \\ 0 & H & \ldots & 0 & 0 \\ & & \ddots & & \\ 0 & 0 & \ldots & H & 0 \\ I_n & I_n & \ldots & I_n & I_n \end{bmatrix}$$

We can now compute $G_L*H_L'$ and verify that the product is an all-zero matrix of size (m+1)n−mk×n(m+1), when (m+1) is even. $H_L$ can be written in tensor product notation as:

$$H_L = \begin{bmatrix} [I_m \mid 0_m] \otimes H \\ 1'_{m+1} \otimes I_n \end{bmatrix}$$

where $I_m$ is an m×m identity matrix, $0_m$ is a column vector of all 0's of length m, and $1'_{m+1}$ is a row vector of all 1's of length (m+1) and $I_n$ is an n×n identity matrix. The vertical bar | denotes a partition of the matrix, i.e., $I_m$ is augmented with $0_m$. To demonstrate that this construction generates a valid $H_L$ matrix for $G_L$, the following example is given, continuing from the example given above, where m=3, n=4, and k=2:

$$H_L = \begin{bmatrix} 1 & 0 & 1 & 0 & 0 & 0 & 0 & 0 & 0 & 0 & 0 & 0 & 0 & 0 & 0 & 0 \\ 0 & 1 & 1 & 1 & 0 & 0 & 0 & 0 & 0 & 0 & 0 & 0 & 0 & 0 & 0 & 0 \\ 0 & 0 & 0 & 0 & 1 & 0 & 1 & 0 & 0 & 0 & 0 & 0 & 0 & 0 & 0 & 0 \\ 0 & 0 & 0 & 0 & 0 & 1 & 1 & 1 & 0 & 0 & 0 & 0 & 0 & 0 & 0 & 0 \\ 0 & 0 & 0 & 0 & 0 & 0 & 0 & 0 & 1 & 0 & 1 & 0 & 0 & 0 & 0 & 0 \\ 0 & 0 & 0 & 0 & 0 & 0 & 0 & 0 & 0 & 1 & 1 & 1 & 0 & 0 & 0 & 0 \\ 1 & 0 & 0 & 0 & 1 & 0 & 0 & 0 & 1 & 0 & 0 & 0 & 1 & 0 & 0 & 0 \\ 0 & 1 & 0 & 0 & 0 & 1 & 0 & 0 & 0 & 1 & 0 & 0 & 0 & 1 & 0 & 0 \\ 0 & 0 & 1 & 0 & 0 & 0 & 1 & 0 & 0 & 0 & 1 & 0 & 0 & 0 & 1 & 0 \\ 0 & 0 & 0 & 1 & 0 & 0 & 0 & 1 & 0 & 0 & 0 & 1 & 0 & 0 & 0 & 1 \end{bmatrix}$$

A verification of the product $G_L*H_L'$ generates a 6×6 all-zero matrix. This confirms that $v_L$ is indeed a codeword in the space of codewords spanned by $G_L$, and $H_L$ can be used to decode $v_L$.

Although each of the individual codeword stored in the data storage media is systematic—in the sense that all the information bits are grouped at one end of each codeword—that property no longer holds for $v_L$ if it is generated from $G_L$ as shown above. However, if the codewords in the individual data storage media are systematic, $v_L$ can be made systematic using one of two methods, to form $v_{LS}$. In a first embodiment, a systematic generator matrix $G_{LS}$ is formed, based on $G_L$, by placing the columns in $G_L$ that correspond to the information bits of each codeword to one end of the $G_{LS}$ matrix. Then, $G_{LS}$ is applied to a concatenation of the information bits of each of the codewords, or a concatenation of the data blocks themselves, as explained previously. In a second embodiment, the long codeword $v_L$ can be made systematic even if it is formed using $G_L$, by rearranging the information bits in $v_L$ so that they occupy either the least significant bits or the most significant bits of $v_{LS}$. However, rearranging the columns of $G_L$ and generating $G_{LS}$ improves the performance of data storage and retrieval system 100, by allowing a simplified generation of $H_{LS}$ from $H_L$, as shown in the following example, expanding on the examples previously discussed, above, where three data storage media are used, i.e., m=3, and n=4 and k=2.

In the example above, since the 4-bit codeword stored on each media is systematic with the information bits occupying the last two bits of the codeword—i.e., the 3$^{rd}$ and the 4$^{th}$ bits of each codeword, or the 3$^{rd}$, 4$^{th}$, 7$^{th}$, 8$^{th}$, 11$^{th}$ and 12$^{th}$ bits of the concatenated code words, in the $G_L$ matrix, columns 3 and 4, 7 and 8, and 11 and 12 are moved to the right-most columns, sequentially of the matrix, that results in all the information bits in the resulting long codeword $v_{LS}$ to occupy the right most, or least significant, bits of $v_{LS}$.

$$G_{LS} = \begin{bmatrix} 1 & 1 & 0 & 0 & 0 & 0 & 1 & 1 & 1 & 0 & 1 & 0 & 0 & 0 & 0 & 0 \\ 0 & 1 & 0 & 0 & 0 & 0 & 0 & 1 & 0 & 1 & 0 & 1 & 0 & 0 & 0 & 0 \\ 0 & 0 & 1 & 1 & 0 & 0 & 1 & 1 & 1 & 0 & 0 & 0 & 1 & 0 & 0 & 0 \\ 0 & 0 & 0 & 1 & 0 & 0 & 0 & 1 & 0 & 1 & 0 & 0 & 0 & 1 & 0 & 0 \\ 0 & 0 & 0 & 0 & 1 & 1 & 1 & 1 & 0 & 0 & 0 & 0 & 0 & 0 & 1 & 0 \\ 0 & 0 & 0 & 0 & 0 & 1 & 0 & 1 & 0 & 1 & 0 & 0 & 0 & 0 & 0 & 1 \end{bmatrix}$$

Since $G_{LS}$ is now in systematic form, i.e., $G_{LS}=[PL|I_6]$, we obtain $H_{LS}=[I_{n-k}|PL']=[I_{10}|PL']$, where n=16 and k=6 for $v_L$.

$$H_{LS} = \begin{bmatrix} 1 & 0 & 0 & 0 & 0 & 0 & 0 & 0 & 0 & 0 & 1 & 0 & 0 & 0 & 0 & 0 \\ 0 & 1 & 0 & 0 & 0 & 0 & 0 & 0 & 0 & 0 & 1 & 1 & 0 & 0 & 0 & 0 \\ 0 & 0 & 1 & 0 & 0 & 0 & 0 & 0 & 0 & 0 & 0 & 0 & 1 & 0 & 0 & 0 \\ 0 & 0 & 0 & 1 & 0 & 0 & 0 & 0 & 0 & 0 & 0 & 0 & 1 & 1 & 0 & 0 \\ 0 & 0 & 0 & 0 & 1 & 0 & 0 & 0 & 0 & 0 & 0 & 0 & 0 & 0 & 1 & 0 \\ 0 & 0 & 0 & 0 & 0 & 1 & 0 & 0 & 0 & 0 & 0 & 0 & 0 & 0 & 1 & 1 \\ 0 & 0 & 0 & 0 & 0 & 0 & 1 & 0 & 0 & 0 & 1 & 0 & 1 & 0 & 1 & 0 \\ 0 & 0 & 0 & 0 & 0 & 0 & 0 & 1 & 0 & 0 & 1 & 1 & 1 & 1 & 1 & 1 \\ 0 & 0 & 0 & 0 & 0 & 0 & 0 & 0 & 1 & 0 & 1 & 0 & 1 & 0 & 1 & 0 \\ 0 & 0 & 0 & 0 & 0 & 0 & 0 & 0 & 0 & 1 & 0 & 1 & 0 & 1 & 0 & 1 \end{bmatrix}$$

The product $G_{LS}*H_{LS}'$ equals a 6×10 all-zero matrix, confirming that $H_{LS}$ is, indeed, the proper parity check matrix for $G_{LS}$. By using the information vector u=[1 1 1 0 0 1] from the example above, $v_{LS}=u*G_{LS}=[1 0 1 1 0 1 0 0 0 0 1 1 1 0 0 1]$. The long codeword is now in systematic form. It can be noted from $v_{LS}$ that the parity check bits in it, i.e., bits 1-10, from the left, are the concatenation of the parity check bits of the codewords (i.e., the first two bits of each codeword), plus the entire codeword $v_4$, generated as the XOR of codewords $v_1$, $v_2$, and $v_3$. Understanding this allows processor 200 a more efficient way of generating the systematic version of the long codeword $v_L$, by simply concatenating the parity bits from each codeword, followed by the XOR-ed version of the individual codewords, and then appending a concatenation of the information bits from the individual codewords.

Tensor Product Interpretation of $G_{LS}$ and $H_{LS}$

In tensor product terms, $G_{LS}$ may be represented by:

$$G_{LS}=((I_m|1_m) \otimes P_{k(n-k)}) \mid ((1_m \otimes I_n) \mid I_{km})$$

where n is the number of bits in each codeword, m is the number of data blocks/codewords generated from each data segment received from host 102, k is the number of bits in each data block, $I_m$, is an m×m identity matrix, $1_m$ is a column vector of all 1's having a length m, P is a portion of G that generates the parity bits of a codeword, and $I_{km}$ is an identity matrix of k×m rows and columns.

If Q is defined as:

$$Q=(I_m|1_m) \otimes P_{k(n-k)} \mid (1_m \otimes I_m)$$

then $$G_{LS}=Q|I_{km}.$$

where Q is a matrix comprising a tensor product of a) a matrix comprising $I_m$ augmented with a column vector of all 1's of length m, and b) a matrix comprising $P_{k(n-k)}$ augmented with a tensor product of the column vector of all 1's of length m and an identity matrix having k×m rows and columns.

This allows formation of $H_{LS}$ as:

$$H_{LS} = I_{n(m+1)-km} | Q'$$

where Q' is the transpose of the matrix Q. Therefore, knowing P from the G matrix of one of the encoders 206 (assuming that each encoder utilizes the same G generator matrix), as well as k, n and m, allows formation of both $G_{LS}$ and $H_{LS}$ for the long codeword in systematic form.

Decoding Algorithm for the Long Codeword

If H is a low-density parity check (LDPC) matrix, constructing $H_L$ in accordance with the teachings herein ensures that it retains a low-density structure. This is because the density of 1's in $H_L$ in the first m rows of the block matrix shown above paragraph 0051 is only (1/m+1) the density of 1's in H. (The contribution of the last block row to the density of 1's is 1/n, which is negligible.) If a decoding algorithm tailored for low-density H matrices—such as a message passing decoding algorithm—is used on H, such an algorithm can also be used on $H_L$ to decode $v_L$ since it also retains the low-density character. Relative to H, the maximum column weight of $H_L$ increases by 1.

If H is an LDPC matrix, in one embodiment, a particular scheduling can be used to decode $v_L$ using the message-passing decoding algorithm executed by decoder 300L, by taking advantage of the fact that only the last n rows of $H_L$ have 1's in them that span all the m individual codewords: each of those rows has (m+1) 1's in it. Decoder 300L can periodically update the log-likelihood-ratio (LLR) values of the bits connected to each of those parity check bits based on the LLR values that were handed to them from the individual codewords at that time. The updated LLR values can then be used by the decoders to continue their decoding. In other words, in this embodiment, the codebits in one of the data storage media interact with, or obtain information from, codebits stored in other data storage media at regular time intervals, not continuously in every iteration. Such a scheduling can also be used in decoding $v_L$ using $H_L$.

Figure 4A:
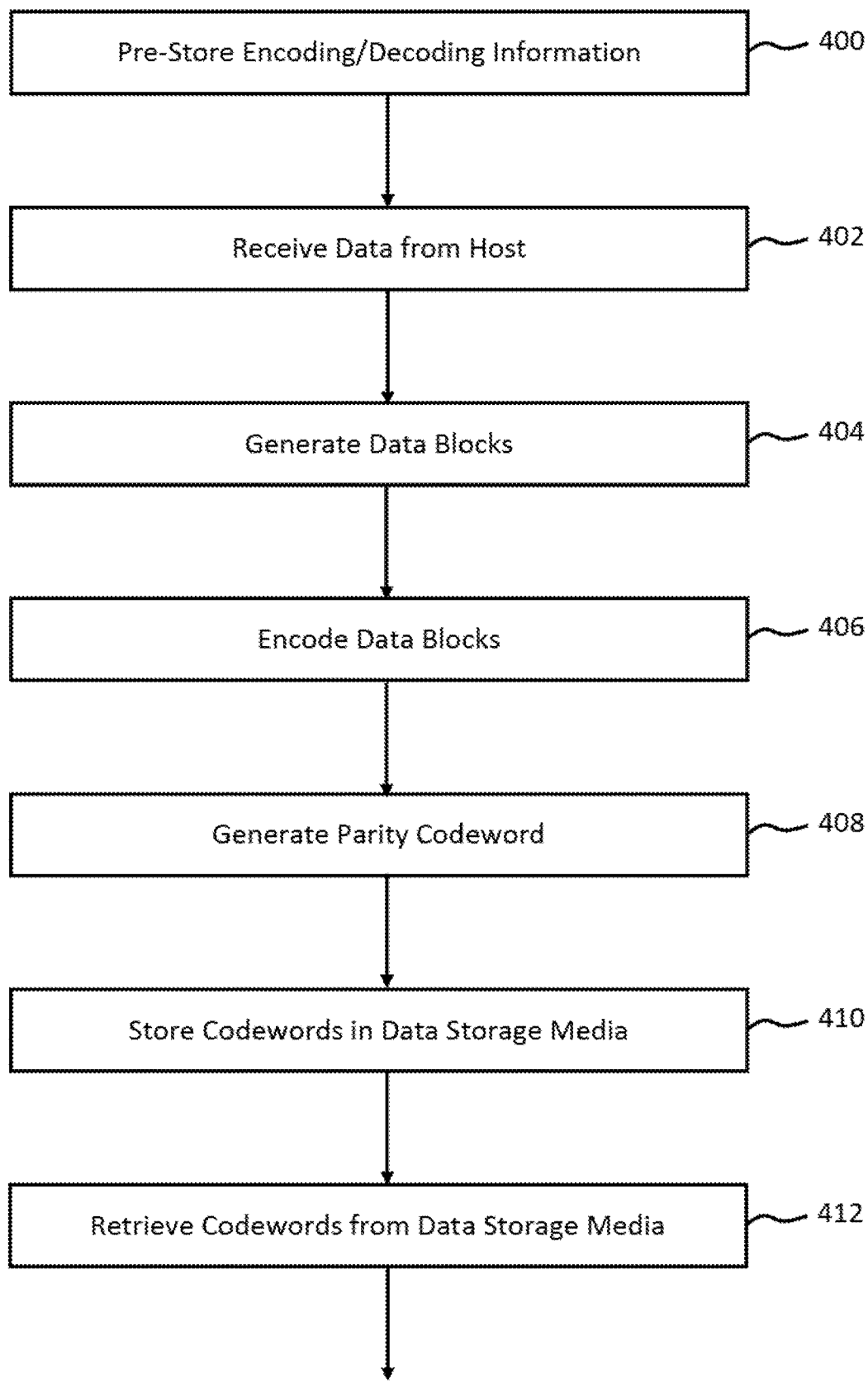
FIGS. 4A and 4B are flow diagrams illustrating one embodiment of a method performed by the data storage and retrieval system as shown in FIG. 1 to store and retrieve data with increased data recovery characteristics.
Figure 4B:
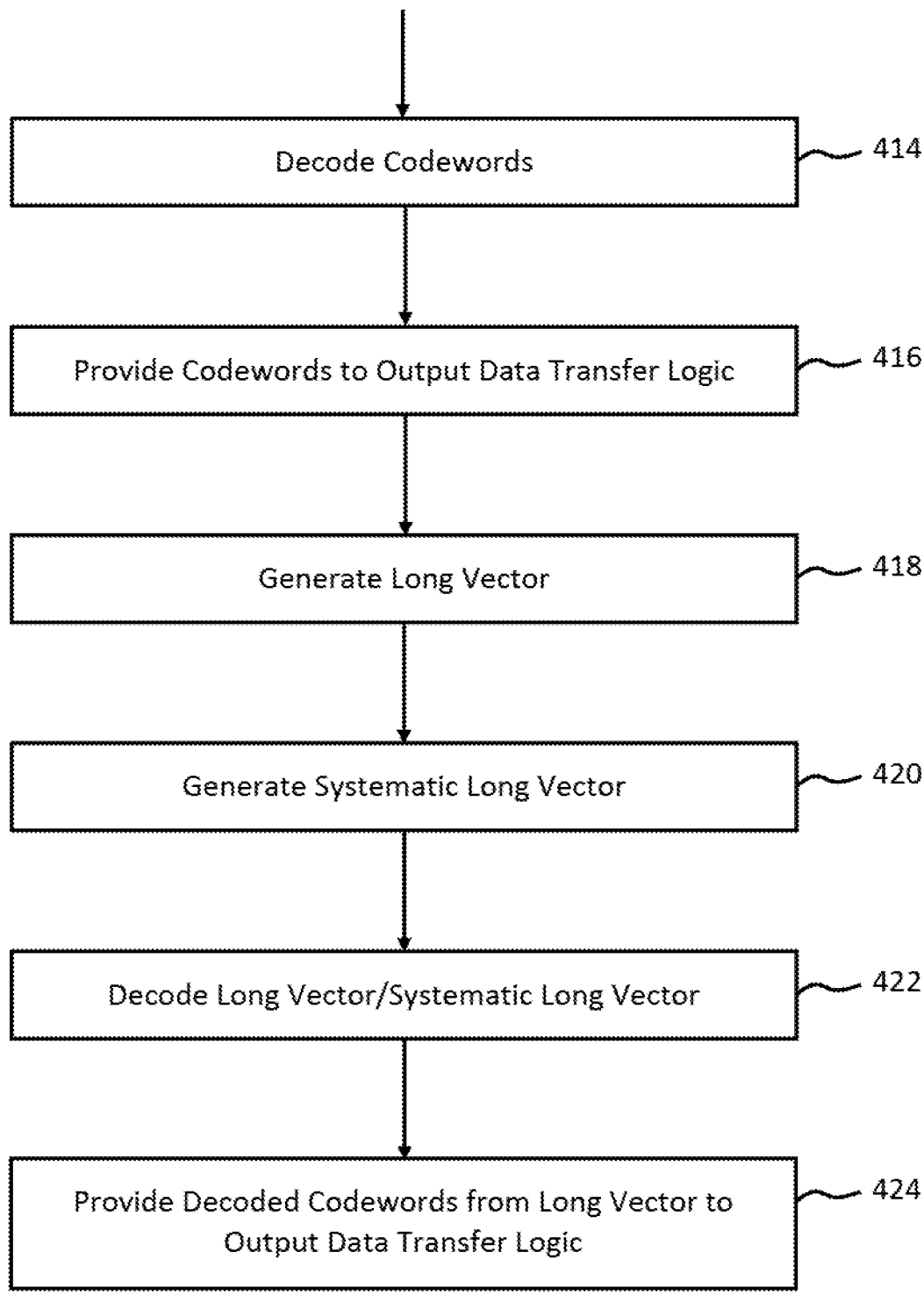

FIG. 4 is a flow diagram illustrating one embodiment of a method performed by data storage and retrieval system 100 to store and retrieve data with increased data recovery characteristics. The method is implemented by one or more processors, executing processor-executable instructions stored in one or more memories, such as processor 200 and memory 202, respectively. It should be understood that in some embodiments, not all of the steps shown in FIG. 4 are performed and that the order in which the steps are carried out may be different in other embodiments. It should be further understood that some minor method steps have been omitted for purposes of clarity.

At block 400, information may be pre-stored in memory 202 and/or the memory of the encoders and/or decoders in order to encode data blocks and decode codewords. For example, one or more of a parity check matrix H, a long parity check matrix $H_L$, a long systematic parity check matrix $H_{LS}$, a generator matrix G, a long generator matrix $G_L$, and a long systematic generator matrix $H_{LS}$ may be stored.

At block 402, data is received by input data transfer logic 204 from one of numerous hosts 102 remotely coupled to data storage and retrieval system 100, typically via the Internet.

At block 404, a predetermined amount of the data from host 102 is divided into m, equal-sized data blocks, generally provided in parallel to a plurality of encoders 206a-206m by input data transfer logic 204. Each of the data blocks comprises k bits.

At block 406, each encoder 206a-206m encodes a respective one of the data blocks using, in one embodiment, LDPC encoding, each encoder 206a-206m using the same generator matrix G stored in memory 202 or locally by each of the encoders. The result is a plurality of codewords, each comprising k information bits and m parity bits, where m is the number of codewords generated for each segment of unencoded data from host 102. In one embodiment, each of the codewords are made systematic by a respective encoder.

At block 408, each of the codewords from the encoders are logically combined with each other using an XOR function, as provided by logic circuitry 208, to generate a parity codeword having a length equal to the length of each of the codewords.

At block 410, each of the codewords are stored in data storage media 108a-108m, and the parity codeword is stored in data storage media $108_{m+1}$. Each of the data storage media may be co-located with data storage server 104 or they may be remotely distributed in the cloud.

At some later time, one of the hosts 102 requests retrieval of data that was previously provided to data storage and retrieval system 100. In response, at block 412, a set of codewords are retrieved in parallel from data storage media 108a-108m.

At block 414, each codeword retrieved from the data storage media are provided to a respective one of the decoders 300a-300m. In one embodiment, each of the decoders decodes a respective one of the codewords using the same parity check matrix H, stored in memory 202 or locally by each of the decoders. An iterative two-step decoding algorithm known as a message passing algorithm may be employed by each of the decoders, where a number of check nodes are first updated based on messages received from all or some variable nodes. In a second step, all or some of the variable nodes may be updated based on messages received from all or some of the check nodes. The process may be repeated until either a codeword has been decoded or until a threshold number of iterations or sub-iterations has been reached.

The messages used in message passing algorithm may be log-likelihood-ratio (LLR) messages, also known as soft information. The Iterative decoders 300a-300m may calculate the LLR messages to correct Or detect errors in a received codeword. Prior to the first iteration of the message passing algorithm, for example, each of the variable nodes may receive an LLR message based on information from the original codeword as provided to any one of the decoders 300a-300m.

The result of the iterative decoding process is a re-creation of the original data blocks created at block 404, assuming that each codeword is decoded without errors.

At block 416, each of the decoded codewords is provided to output data transfer logic 304, where they are combined to re-create the original data that was provided by the requesting host 102. In the event that one or more of the decoders 300a-300m cannot decode a respective codeword, in one embodiment, traditional XOR techniques may be used to recover the "bad" codeword.

At block 418, in the event that two or more codewords are not properly decoded by decoders 300a-300m, an attempt may be made to decode all of the codewords together by creating a long vector $v_L$ by processor 200. In one embodiment, processor 300 creates $V_L$ as a concatenation of codewords $v_1$-$v_m$ plus the result of an XOR function of all of the codewords $v_1$-$v_m$. Alternatively, $v_L$ may be created by multiplying each of the data blocks $u_1$-$u_m$ by a long generator matrix $G_L$ stored in memory 202 or by decoder 300L, as discussed previously.

In one embodiment, at block 420, $v_L$ may be made systematic ($v_{LS}$) by processor 200, by multiplying a systematic generator matrix $G_{LS}$ by an information vector comprising a concatenation of data blocks $u_1$-$u_m$. The $G_{LS}$ may be formed from the $G_L$ matrix by processor 200 or decoder 300L, or it may be pre-stored in memory 202 or a memory of decoder 300L. In one embodiment, $G_{LS}$ is formed by re-arranging the columns of the $G_L$ matrix, by placing the columns in $G_L$ that correspond to the information bits of each codeword to one end of the $G_{LS}$ matrix.

In a second embodiment, $v_L$ can be made systematic if it is formed using $G_L$, by rearranging the information bits in $v_L$ so that they occupy either the least significant bits or the most significant bits of $v_{LS}$.

At block 422, either the long vector $v_L$ or the long systematic vector $v_{LS}$ may be decoded by decoder 300L. In the case of $v_L$, a long parity check matrix $H_L$, stored in either memory 202 or decoder 300L, is applied to $v_L$, using the iterative decoding process discussed above. In the case of $v_{LS}$, a long, systematic parity check matrix $H_{LS}$, stored in either memory 202 or decoder 300L, is applied to $v_{LS}$, using the iterative decoding process discussed above. It should be noted that the same decoding algorithm to decode $v_L$ or the long systematic vector $v_{LS}$ could be the same as the decoding algorithm used by decoders 300a-300m. During the decoding process, processor 200 or decoder 300L periodically updates the log-likelihood-ratio (LLR) values of the bits connected to each of the parity check bits based on the LLR values that were provided to the parity check bits from the individual codewords at that time. In one embodiment, the updated LLR values are used by the individual decoders to continue their decoding.

At block 424, processor 200 determines whether the long vector was decoded correctly, using techniques well known in the art. If so, then each of the decoded codewords are provided to output data transfer logic 304, where they are combined to form the original data segment that had been provided by one of the hosts 102. The decoded codewords from decoders 300a-300m are ignored. Thus, by creating the long vector and decoding it with a long parity check matrix, data storage and retrieval system 100 may be able to better tolerate errors and erasures, because the codebits of each codeword in the long vector interact with or obtain information from each other.

The methods or algorithms described in connection with the embodiments disclosed herein may be embodied directly in hardware or embodied in processor-readable instructions executed by a processor. The processor-readable instructions may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components.

Accordingly, an embodiment of the invention may comprise a computer-readable media embodying code or processor-readable instructions to implement the teachings, methods, processes, algorithms, steps and/or functions disclosed herein.

It is to be understood that the decoding apparatus and methods described herein may also be used in other communication situations and are not limited to RAID storage. For example, compact disk technology also uses erasure and error-correcting codes to handle the problem of scratched disks and would benefit from the use of the techniques described herein. As another example, satellite systems may use erasure codes in order to trade off power requirements for transmission, purposefully allowing for more errors by reducing power and chain reaction coding would be useful in that application. Also, erasure codes may be used in wired and wireless communication networks, such as mobile telephone/data networks, local-area networks, or the Internet. Embodiments of the current invention may, therefore, prove useful in other applications such as the above examples, where codes are used to handle the problems of potentially lossy or erroneous data.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

We claim:

1. A method for data storage and retrieval, comprising:
generating a plurality of data blocks from a quantity of unencoded data;
receiving, by a plurality of encoders, a respective one of the plurality of data blocks;
encoding the plurality of data blocks by the plurality of encoders, respectively, to generate a plurality of codewords;
logically combining the plurality of codewords to generate an encoded parity block;
storing the plurality of codewords and the encoded parity block in a plurality of data storage media, respectively;
retrieving the plurality of codewords and the encoded parity block from the data storage media;
decoding each of the plurality of codewords;
when at least two of the codewords cannot be decoded correctly:
generating a long vector from the plurality of codewords and the encoded parity block; and
decoding the long vector using a long parity check matrix to re-create the data blocks.

2. The method of claim 1, wherein generating the long vector comprises:
concatenating the plurality of codewords and the encoded parity block.

3. The method of claim 1, wherein generating the long vector comprises:
applying a long generator matrix $G_L$ to the plurality of data blocks.

4. The method of claim 3, wherein the long generator matrix comprises a matrix having a number of rows equal to a number of the plurality of data storage media multiplied by a length of each of the plurality of data blocks, and a number of columns equal to the number of the plurality of data storage media plus one, multiplied by a length of each of the plurality of codewords.

5. The method of claim 3, wherein the long generator matrix comprises a tensor product of a) a matrix comprising an identity matrix and a column vector of all 1's, and b) a generator matrix G used to encode the data blocks by the encoders.

6. The method of claim 3, wherein encoding the plurality of data blocks by the plurality of encoders comprises:
   encoding each of the plurality of data blocks by a respective encoder, each encoder applying a generator matrix G to a respective data block;
   wherein the long generator matrix $G_L$ comprises a tensor product of a) a matrix comprising an identity matrix augmented with a column vector comprising all 1's, and b) the generator matrix G.

7. The method of claim 1, wherein decoding each of the codewords comprises:
   decoding each of the plurality of codewords by a plurality of decoders, respectively.

8. The method of claim 1, wherein decoding each of the plurality of codewords by a plurality of decoders, respectively, comprises:
   applying a same parity check matrix by the plurality of encoders to the plurality of codewords, respectively.

9. The method of claim 1, wherein the long parity check matrix comprises:
   a matrix comprising a tensor product of a) an identity matrix augmented with a column vector comprising all 0's, and b) a parity check matrix H used to decode the codewords; and
   a second tensor product of a) a transpose of a column vector comprising all 1's, and b) a second identity matrix.

10. The method of claim 1, wherein the long vector comprises a long systematic vector comprising information bits, from the plurality of data blocks, and parity bits, the method further comprising:
    forming the long systematic vector by re-arranging the information bits to occupy two or more least or most significant bits of the long systematic vector;
    wherein the long parity check matrix comprises a systematic matrix.

11. The method of claim 10, wherein the systematic matrix comprises $I_{n(m+1)-km}|Q'$, where n is a number of bits in the long vector, m is a number of the plurality of codewords, k is a number of bits of each of the plurality of data blocks and Q' comprises a transpose of a tensor product of a) a matrix comprising $I_m$ augmented with a column vector of all 1's of length m, and b) a matrix comprising $P_{k(n-k)}$ augmented with a tensor product of the column vector of all 1's of length m and an identity matrix having k×m rows and columns.

12. A data retrieval system, comprising:
    a plurality of decoders;
    a memory for storing processor-executable instructions and a long parity check matrix; and
    a processor coupled to the plurality of decoders and the memory for executing the processor-executable instructions that causes the data retrieval system to:
       retrieve, by the plurality of decoders, a plurality of codewords from a plurality of data storage media, respectively;
       decode each of the plurality of codewords by the plurality of decoders;
       when at least two of the codewords cannot be decoded correctly:
          retrieve an encoded parity block from a first data storage media;
          generate, by the processor, a long vector from the plurality of codewords and the encoded parity block; and
          decode the long vector using the long parity check matrix to re-create a plurality of data blocks that were stored by the data retrieval system.

13. The data retrieval system of claim 12, wherein the processor-executable instructions for decoding each of the plurality of codewords comprises instructions that cause the data retrieval system to:
    apply a same parity check matrix by the plurality of encoders to the plurality of codewords, respectively.

14. The data retrieval system of claim 12, wherein the processor-executable instructions for generating the long vector comprises instructions that causes the data retrieval system to:
    concatenate the plurality of codewords and the encoded parity block.

15. The data retrieval system of claim 12, wherein the long parity check matrix comprises:
    a matrix comprising a tensor product of a) an identity matrix augmented with a column vector comprising all 0's, and b) a parity check matrix H used to decode the codewords; and
    a second tensor product of a) a transpose of a column vector comprising all 1's, and b) a second identity matrix.

16. The data retrieval system of claim 12, wherein the long vector comprises a long systematic vector comprising information bits, from the plurality of data blocks, and parity bits, wherein the processor-executable instructions further comprise instructions that cause the data retrieval system to:
    form, by the processor, the long systematic vector by re-arranging the information bits to occupy two or more least or most significant bits of the long systematic vector;
    wherein the long parity check matrix comprises a long systematic matrix.

17. The data retrieval system of claim 16, wherein the long systematic matrix comprises $I_{n(m+1)-km}|Q'$, where n is a number of bits in the long vector, m is a number of the plurality of codewords, k is a number of bits of each of the plurality of data blocks and Q' comprises a transpose of a tensor product of a) a matrix comprising $I_m$ augmented with a column vector of all 1's of length m, and b) a matrix comprising $P_{k(n-k)}$ augmented with a tensor product of the column vector of all 1's of length m and an identity matrix having k×m rows and columns.

* * * * *